(12) United States Patent
Kailash et al.

(10) Patent No.: US 8,429,111 B1
(45) Date of Patent: Apr. 23, 2013

(54) ENCODING AND COMPRESSION OF STATISTICAL DATA

(75) Inventors: Kailash Kailash, San Jose, CA (US); Arcady V. Schekochikhin, Cupertino, CA (US); Srikanth Devarajan, San Jose, CA (US); Narinder Paul, Sunnyvale, CA (US)

(73) Assignee: Zscaler, Inc., San Jose, CA (US)

( * ) Notice: Subject to any disclaimer, the term of this patent is extended or adjusted under 35 U.S.C. 154(b) by 931 days.

(21) Appl. No.: 12/185,443

(22) Filed: Aug. 4, 2008

(51) Int. Cl.
*G06F 17/00* (2006.01)
*G06N 5/02* (2006.01)

(52) U.S. Cl.
USPC .......................................................... 706/46

(58) Field of Classification Search .............. 706/46, 706/45, 62; 710/68
See application file for complete search history.

(56) References Cited

U.S. PATENT DOCUMENTS

| | | | | |
|---|---|---|---|---|
| 5,608,396 | A * | 3/1997 | Cheng et al. ..................... | 341/50 |
| 6,104,392 | A * | 8/2000 | Shaw et al. ..................... | 715/749 |
| 6,347,374 | B1 * | 2/2002 | Drake et al. ..................... | 726/1 |
| 6,456,993 | B1 * | 9/2002 | Freund ............................ | 706/46 |
| 6,946,972 | B2 * | 9/2005 | Mueller et al. ................ | 340/870.02 |
| 6,975,963 | B2 * | 12/2005 | Hamilton et al. .............. | 702/182 |
| 6,990,628 | B1 * | 1/2006 | Palmer et al. .................. | 715/234 |
| 2001/0013008 | A1 * | 8/2001 | Waclawski ...................... | 705/10 |
| 2001/0031092 | A1 * | 10/2001 | Zeck et al. ...................... | 382/239 |
| 2004/0215598 | A1 * | 10/2004 | Bala ................................ | 707/2 |
| 2006/0184652 | A1 * | 8/2006 | Teodosiu et al. .............. | 709/221 |

OTHER PUBLICATIONS

"IronPort Web Security Monitor", IronPort Systems, Inc., P/N 435-0219-2 2/07, Doc Release, Feb. 2007.*
Qu et al, "Multivariate Statistical Analysis for Network Attacks Detection", The 3rd ACS/IEEE International Conference on Computer Systems and Applications, 2005, Date of Conference: 2005.*
Lee et al, "Adaptive Intrusion Detection: A Data Mining Approach", Issues on the Application of Data Mining, Artificial Intelligence Review 14: 533-567, 2000.*

\* cited by examiner

*Primary Examiner* — Jeffrey A Gaffin
*Assistant Examiner* — Ilya Traktovenko
(74) *Attorney, Agent, or Firm* — Clements Bernard PLLC; Lawrence A. Baratta, Jr.; Christopher L. Bernard (57) ABSTRACT

Methods, systems, and apparatus, including computer program products, for generating or using augmentation queries. In one aspect, statistical model of statistical data is used to support lossless predictive compression. Data instances are identified in statistical data and classified into one of a plurality of data types. Each data type is associated with a corresponding compression process that is used to compress data instances of that type.

24 Claims, 4 Drawing Sheets

ENCODING AND COMPRESSION OF STATISTICAL DATA

BACKGROUND

This specification relates to encoding and compress of statistical data, such as log records.

Statistics for monitoring the health of a system can require several thousand variables ranging from hardware, peripheral, network, operating system, memory, process variables indicating errors, exceptions and events such as virus detection counts and content classification counts. These variables are sampled over small sampling periods for logging purposes. Logging these statistical data can create an extremely large data collection. For example, a system that logs millions of transactions per second generates log record data that are too large to store or transmit efficiently. Assuming four bytes of information per variable, and 5,000 variables sampled every second, the bandwidth requirement for statistics transmission alone is 160 Kbps.

Data compression can be used to increase storage and transmission efficiency. However, existing compression and encoding processes does not achieve compression ratios high enough to efficiently manage large amounts of statistics data, as they are generic techniques applied on data instances in statistics data. For example, using Run Length Encoding, a sequence of zeros can be compressed into a count as long as they are consecutive, and thus its compression ratio is dependent on the arrangement of the variables and their non-zero occurrences within this interval. Compression ratios of approximately 1:30 are typical under this scheme.

Another compression process is LZ77, which identifies common longest prefixes to be referenced later in the data. Compression ratios of about 1:4 are typical under this scheme. Another compression process is dictionary based compression in which an index is used to represent a word that longer than the index. Compression ratios of approximately 1:4 are typical under this scheme.

The compression processes above do not attribute any significance to individual data instances, e.g., statistical counts, to identifying the causes of redundancy, and thus all data are compressed by the same compression process. A compression process that does attribute significance to individual data is Robust Header Compression (ROHC). Here a flow of data instances, such as a sequence of packets between two fixed endpoints, is compressed by eliminating protocol header information that is known to be a constant, or known to vary by a constant amount between two consecutive packets of the flow. Because the scheme does not assume ordered delivery of data, periodic uncompressed packets are sent to synchronize the data between the sender and receiver. This compression process, however, does not identify redundancies across the fields of the protocol header; each header field is considered in isolation.

A different approach is predictive encoding used in video compression schemes. In these compression schemes, the movements of the objects across scenes are predicted to compress video data. These techniques, however, are not lossless, and thus yield high compression ratios at the expense of data quality.

SUMMARY

In general, one aspect of the subject matter described in this specification can be embodied in methods that include the actions of identifying data instances in statistical data; classifying each data instance into one of a plurality of data types, each data type being associated with a corresponding compression process and being indicative of one of a first order redundancy, a second order redundancy, or a third order redundancy; removing first order redundancies in the data instances associated with a data type indicative of the first order redundancy; removing second order redundancies in the data instances associated with a data type indicative of the second order redundancy; and removing third order redundancies in the data instances associated with a data type indicative of the third order redundancy. Other implementations of this aspect include corresponding systems, apparatus, and computer program products.

Another aspect of the subject matter described in this specification can be embodied in methods that include the actions of identifying data instances in statistical data; classifying each data instance into one of a plurality of data types, each data type being associated with a corresponding compression process; and compressing each data instance according to the compression process of the associated data type of the data instance. Other implementations of this aspect include corresponding systems, apparatus, and computer program products.

The following optional advantages can be realized by use systems or methods embodying the subject matter described herein. None of the following advantages need be realized in any one implementation. The compression techniques herein can reduce data store requirements by large factors, and can thus likewise introduce robustness to link failures by an equal magnitude.

The compression techniques herein can identify the data variations and classify such variations automatically and select a corresponding compression process. Hence it is a profile-free generic compression scheme that can be applied to various data elements including statistics.

As a sampling interval is reduced in time, the compression ratio of the compression techniques herein increase. As the time interval decreases, so too do changes in the statistical data, resulting in finer changes. These finer changes can be classified as ordered redundancies for which compression processes can be applied.

The encoded data do can be stripped of enterprise specific identifiers, names of data attributes, or fixed format, e.g., 4 variables per sample. Such anonymized data makes it more difficult to compromise an enterprise's security if the data are obtained by an adversary. The data may be further protected by encrypting a compression context associated with the data.

The encoded data generated by the compression techniques herein are indicative of statistical variations in monitored traffic. Accordingly, detection and/or diagnosis of virus outbreaks, abnormal patterns of traffic, and so on can be detected by abrupt changes in compression ratios.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

§1.0 Example Environment

Figure 1:
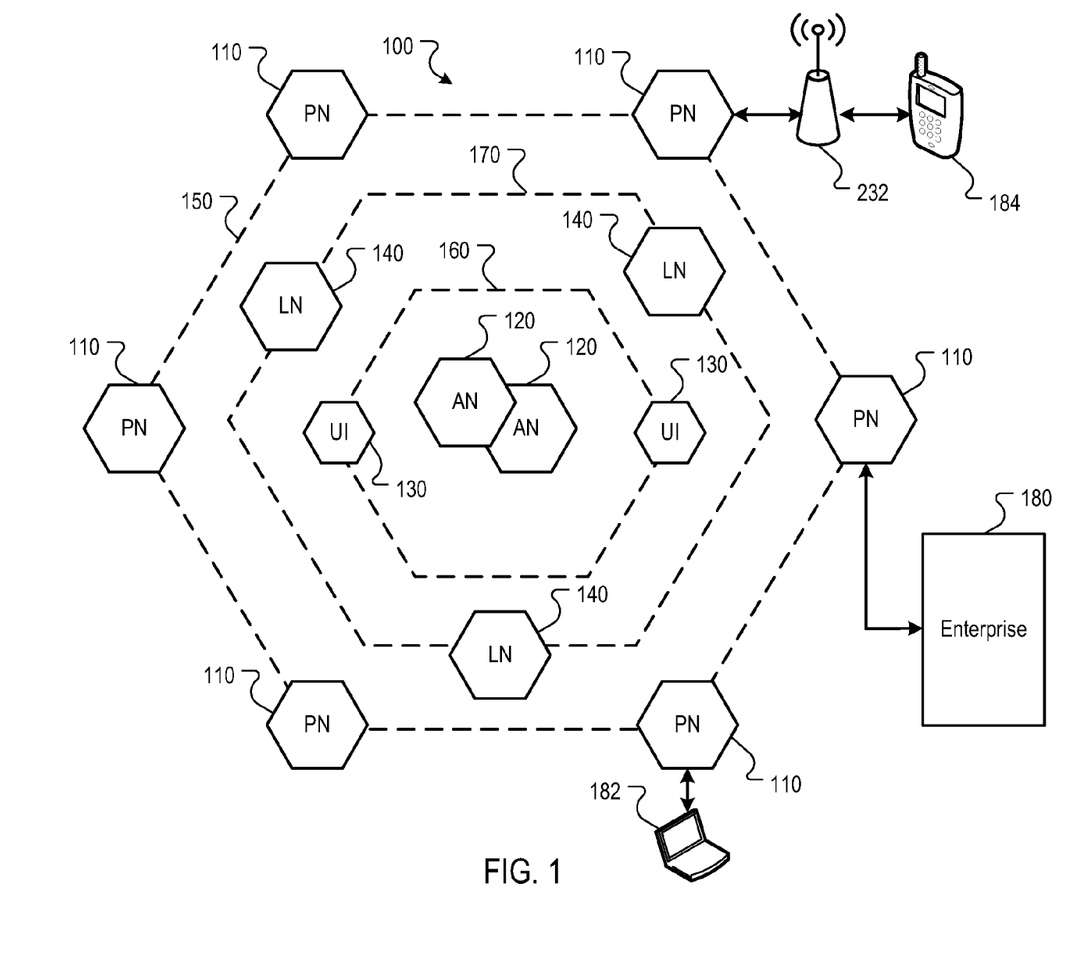
FIG. 1 is a block diagram of a system in which a compression system is utilized.

FIG. 1 is a block diagram of an example system 100 in which a compression system is utilized. The system 100 is a distributed security system that can, for example, be implemented as an overlay network in a wide area network (WAN), such as the Internet. The system 100 includes content processing nodes 110 that detect and preclude the distribution of security threats, e.g., malware, spyware, and other undesirable content sent from or requested by an external system. Example external systems can include an enterprise 180, a computer device 182, and a mobile device 184, or other network and computing systems.

In an example implementation, each processing node 110 can include a decision system, e.g., data inspection engines that operate on a content item, e.g., a web page, a file, an e-mail message, or some other data or data communication that is sent from or requested by one of the external systems. In some implementations, all data destined for or received from the Internet is processed through a processing node 110. In other implementations, specific data specified by each external system, e.g., only e-mail, only executable files, etc., is process through a processing node 110.

Each processing node 110 can generate a decision vector $D=[d_1, d_2, \ldots, d_n]$ for a content item of one or more parts $C=[c_1, c_2, \ldots, c_m]$. Each decision vector can identify a threat classification, e.g., clean, spyware, malware, undesirable content, innocuous, unknown, etc. For example, the output of each element of the decision vector D can be based on the output of one or more data inspection engines. In some implementations, the threat classification can be reduced to a subset of categories e.g., violating, non-violating, neutral, unknown. Based on the subset classification, a processing node 110 may allow distribution of the content item, preclude distribution of the content item, allow distribution of the content item after a cleaning process, or perform threat detection on the content item.

In some implementations, the actions taken by a processing node 110 can be determinative on the threat classification of the content item and on a security policy of the external system to which the content item is being sent from or from which the content item is being requested. A content item is violating if, for any part $C=[c_1, c_2, \ldots, cm]$ of the content item, at any processing node 110, any one of the data inspection engines generates an output that results in a classification of "violating."

Each processing node 110 can be implemented by a plurality of computer and communication devices, e.g., server computers, gateways, switches, etc. In some implementations, the processing nodes 110 can serve as an access layer 150. The access layer 150 can, for example, provide external system access to the security system 100. In some implementations, each processing node 110 can include Internet gateways and a plurality of server computers, and the processing nodes 110 can be distributed through a geographic region, e.g., throughout a country. According to a service agreement between a provider of the system 100 and an owner of an external system, the system 100 can thus provide security protection to the external system at any location throughout the geographic region.

Data communications can be monitored by the system 100 in a variety of ways, depending on the size and data requirements of the external system. For example, an enterprise 180 may have multiple routers that are used to communicate over the Internet, and the routers may be configured to establish communications through the nearest (in traffic communication time) processing node 110. A mobile device 184 may be configured to communication to a nearest processing node 110 through any available wireless access device, such as an access point, or a cellular gateway. A single computer device 182, such as a consumer's personal computer, may have its browser and e-mail program configured to access the nearest processing node 110, which, in turn, serves as a proxy for the computer device 182. Alternatively, an Internet provider may have all of its customer traffic processed through processing nodes 110.

In some implementations, the processing node 110 act as a forward proxy that receives user requests to external servers addressed directly to the processing node 110. In other implementations, the processing node 110 may access user requests that are passed through processing node 110 in the transparent mode. A protected system, e.g., enterprise 180, can, for example, choose one or both of these modes.

In another example, the processing nodes 110 can be deployed at Internet service provider (ISP) nodes. The ISP nodes can redirect subject traffic to the processing nodes 110 in a transparent proxy mode. Protected systems, such as the enterprise 180, can use a multiprotocol label switching (MPLS) class of service for indicating the subject traffic that is to be redirected.

In another transparent proxy mode example, a protected system, such as the enterprise 180, may identify a processing node 110 as a next hop router for communication with the external servers.

In some implementations, the processing nodes 110 can communicate with one or more authority nodes 120. The authority nodes 120 can store policy data for each external system and can distribute the policy data to each processing node 110. The policy data can, for example, define security policies for a protected system, e.g., security policies for the enterprise 180. Example policy data can define access privileges for users, web sites and/or content that is disallowed, restricted domains, etc. The authority nodes 120 can distribute the policy data to the access nodes 110.

In some implementations, the authority nodes 120 can also distribute threat data that includes the classifications of content items according to threat classifications, e.g., a list of known viruses, a list of known malware sites, spam e-mail domains, etc. The distribution of threat data between the processing nodes 110 and the authority nodes 120 can implemented by push and pull distribution schemes described in more detail below.

In some implementations, each authority node 120 can be implemented by a plurality of computer and communication devices, e.g., server computers, gateways, switches, etc. In some implementations, the authority nodes 110 can serve as an application layer 160. The application layer 160 can, for example, manage and provide policy data, threat data, and data inspection engines and dictionaries for the processing nodes.

Other application layer functions can also be provided in the application layer, such as a user interface front-end 130. The user interface front-end 130 provides a user interface through which users of the external systems can provide and define security policies, e.g., whether e-mail traffic is to be monitored, whether certain web sites are to be precluded, etc.

Another application capability that can be provided through the user interface front-end 130 is security analysis and log reporting. The underlying data on which the security analysis and log reporting functions operate are stored in logging nodes 140, which serve as a data logging layer 170. Each logging node 140 can store data related to security operations and network traffic processed by the processing nodes 110 for each external system.

§2.0 Compression Processing

Statistics for monitoring the status of the system 100 can require several thousand variables ranging from hardware, peripheral, network, operating system, memory, process variables indicating errors, exceptions and events such as virus detection counts, and content classification counts. For a monitoring period of approximately 1 second, statistics have shown that less than 1% of these variables change within the sampling period, e.g., 0.8%. Of the data that change, approximately 65% of the variables change by 1. These change patterns and characteristics can be exploited to achieve high compression ratios.

Figure 2:
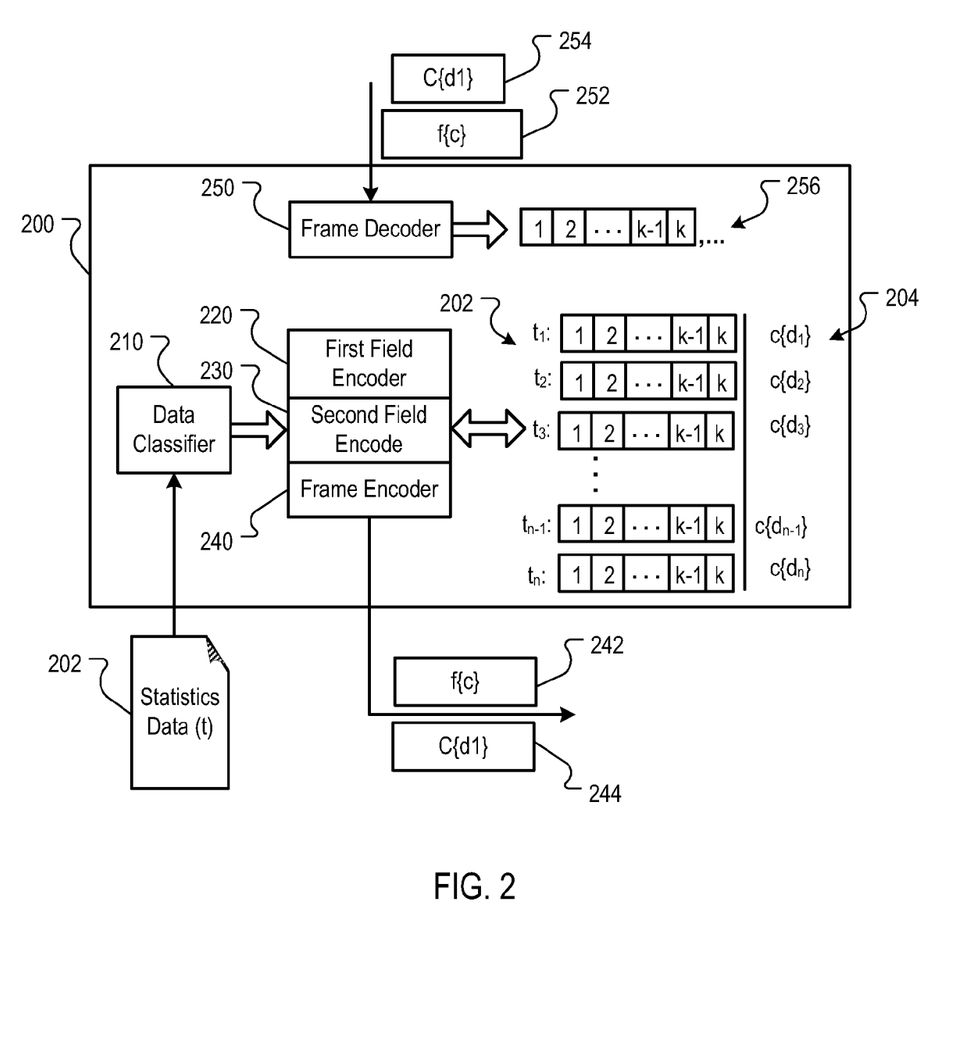
FIG. 2 is a block diagram of an example compression system.

FIG. 2 is a block diagram of an example compression system 200 that achieves high compression ratios based on the change patterns and characteristics of statistical data 202. The compression system 200 can be used in any of the processing nodes 110, authority nodes 120 and/or logging nodes 140.

As illustrated in FIG. 2, statistics data 202 can be received and time stamped for each monitoring period, e.g., n monitoring periods for times $t_1$-$t_n$. In uncompressed form, the statistics data has k canonical form elements, and each element can have one or more data instances. By way of example, statistics data 202 to report requested URLs, CPU percentage, session disconnects, blocked URLs, and a time stamp can be of the canonical form:

[URL, CPU %, Disconnects, URLs Blocked, Time]

Three example samples of the statistics data 202 are shown in Table 1 below.

TABLE 1

| URLS | CPU % | Disconnects | URLs Blocked | Time |
|---|---|---|---|---|
| www.example1.com | 12 | 0 | 1 | 1000 |
| www.example2.com | | | | |
| www.example1.com | | | | |
| www.example3.com | | | | |
| www.example2.com | 13 | 0 | 0 | 1001 |
| www.example2.com | | | | |
| www.example1.com | | | | |
| www.example3.com | | | | |
| www.example1.com | 15 | 0 | 0 | 1002 |
| www.example2.com | | | | |
| www.example2.com | | | | |
| www.example3.com | | | | |
| www.example1.com | 18 | 1 | 0 | 1003 |
| www.example2.com | | | | |
| www.example3.com | | | | |
| www.example3.com | | | | |
| www.example3.com | | | | |

During each time interval, the sampled statistical data include data for URLs request, CPU percentage usage, the number of session disconnects, the number of blocked URLs, and the time at which the samples are collected. The statistics data 202 of Table 1 are simplified examples of statistics data; in an actual system, each sample of statistics data could include thousands or even tens of thousands of data instances.

Redundancies in the statistics data 202 occur in various orders, and can be classified into first, second and third order redundancies. First order redundancies are redundancies where the same value of a data instance occurs in multiple portions of data, and which can be detected in a single sample of statistics data. For example, for the data at time 1000, the two instances of the URL www.example1.com are a first order redundancy.

Second order redundancies are redundancies attributed to constant difference between multiple occurrences of the same data instance, and which are detected in two or more samples of statistics data. Special cases of second order redundancy occurs when the difference is zero, or one. For example, the second order redundancy between the statistics data for times 1001 and 1002 for the data instance CPU % is 2.

Third order redundancies are redundancies when the difference between multiple occurrence of the same data instance is varying by same amount with respect to a given interval in time, and which are detected in two or more samples of statistics data. For example, for the data instance of CPU %, over the four sample times of 1001, 1002, 1003 and 1004, a third order redundancy of 1 occurs. The third order redundancy value of 1 indicates that "difference of the difference" between each sample period is 1, i.e., the difference between times 1000 and 1001 is 1; between 1001 and 1002, 2; between 1002 and 1003, 3; and the difference of these differences is 1.

The system 200 identifies and classifies these redundancies and selects corresponding compression processes for removing these redundancies. As a result of these redundancy-based compression processes, the statistical data communicated at each sampling interval is a set of exceptions from quiescent (e.g., most recent) patterns of deviation. Thus, the system 200 realizes high compression ratios, and also facilitates the detection of abnormal events, such as virus outbreaks, traffic surges, denial of service attacks, and so on. Such events can, for example, be detected by a sudden decrease in a compression ratio, as drastic changes in system parameters can reduce the number of second and third order redundancies. In other implementations, the system 200 can facilitate such detections based on the values in the encoded and compressed data, as many of these values are indicative of system resource allocations.

In an example implementation, the system 200 includes a data classifier 210, a first field encoder 220, a second field encoder 230, a frame encoder 240, and a frame decoder 250. The data classifier 210 classifies the sampled statistics data and identifies redundancies. The first field encoder 220, the second field encoder 230 and the frame encoder 240 remove these redundancies and generate a frame 242 of data for transmission. In some implementations, the first field encoder 220, the second field encoder 230, and the frame encoder 240 are configured to remove first, second and third order redundancies, respectively.

The first field encoder 220 can generate compressed data 204 for each sample of statistical data 202, e.g., compressed data c $\{d_1\}$ for statistical data 202 time stamped at $t_1$; etc. The second field encoder 230 and frame encoder 240 can generate further compressed data 204 based on the redundancies identified by the data classifier 210 and the compressed data c$\{d\}$ generated by the first field encoder 220. The frame decoder 250 can receive a frame 252 and decompress the compressed statistical data samples in the frame into the statistical data samples 256, or representations thereof.

In operation, the data classifier 210 receives a sample of statistics data 202 during a monitoring period of a duration t. In some implementations, the monitoring period is 1 second; other monitoring periods can also be used. The data classifier 210 classifies the current occurrence of data instances into one of plurality of data types, and each data type has an associated compression process. Example data types and compression processes are shown in Table 2 below. More or fewer data types and compressions processes can also be used.

TABLE 2

| Data Type | Compression Process | Typical compression ratio |
|---|---|---|
| Constant Data | Presence Vector | 1:50 |
| Time varying, predictable | Differential Compression | 1:4 |
| Occasional Occurrence | Zero Byte Compression | High (1:100) |
| Time varying, linear | Opcode compression | 1:8 |
| Whole records | LZ77 | 1:4 |
| Time varying | Delta Compression | 1:10 |
| Vary by 1 | 1 bit compression | 1:8 |

Examples of constant data types are column names, IP addresses, URLs, user names, company names, and other data instances that do not change over time. Constant data can also be identified as first order redundancies, and can be removed by the first field encoder 220. In some implementations, such constant data can be indexed in a dictionary to reduce space requirements. The indexing can be used to generate a presence vector representation of the constant data. For example, to denote a particular URL (http://www.example1.com in Table 1) that received 300 hits during a sampling period, the presence vector can be <100, 300>, where 100 is the index of the URL and 300 is the hit count. Thus, the presence vector <100, 300> results in a compression ratio of approximately 100, which is proportional to the hit count.

Examples of time varying, predictable data types are time stamps. These likewise can be identified as first order redundancies and can be removed by the first field encoder 220. For example, the values of the time data instance of Table 1 vary by 1 (or some other value, e.g., 10). If the data change is constant for each sample, then the data instance can also be modeled as a first order redundancy, as it can be identified and compressed (e.g., omitted). Only when the value differs from the expected value is a value for the data instance compressed. In some implementations, the value is compressed as a differential value, i.e., if an expected value is 1,000, and the actual value is 1002, the value of 2 is used to represent the value 1,002.

Examples of occasional occurrence data types are errors, exceptions, and events. These can also be identified as first order redundancies and can be removed by the first field encoder 220 when the data instance value indicates no error, exception or event occurred. Only when the data instance value indicates a presence are the values represented.

Examples of time varying, linear data types are the number of packets received and transmitted. Examples of time varying data are CPU usage, memory usage, number of URLs hit, number of processes, etc. Such data can be identified as first, second, or order redundancies, and can be removed by the first field encoder 220, the second field encoder 230, or the frame encoder 240, for example, by the use of opcode compression and delta compression.

In some implementations, an entire record may need to be compressed, e.g., a record that includes a unique URL requested that is not indexed by the system 200. Any lossless compression process can be used, such as LZ77, by any of the encoders 220, 230 or 240.

Examples of Vary by 1 data types are data instances that tend to change an incremental amount during a sampling period. For example, for a sampling interval of 1 second, over 50% of data instances may only vary by a unitary amount. This can be identified as a second order redundancy and removed by the dependent field encoder 240 by encoding the data as a bit vector.

In some implementations, data instances that are dependent on other data instances can also be compressed by the second field encoder 230. For example, every page access of a URL generates similar hit counts on the embedded objects associated with the URL. The number of objects is typically on the order of 80 per page. Thus, hits on the dependent objects can be represented in relation to the parent object. If the relationship is 1:1, then the dependent objects' counts are not represented for each object, but instead are represented by the count of the parent.

The removal of first order redundancies can, in turn, generate second order redundancies that can be removed. For example, after the first field encoder 220 compresses constant data into presence vectors for a for a set of 100 unrelated URLs with corresponding hit counts, the presence vectors for several samples of statistical data can be delta encoded if the indexes and hits result in a second or third order redundancy.

The frame encoder 240 generates a frame 242 that includes the encoded differences in the statistics. The frame 242 can be generated from the compressed data 204. In some implementations, the generated frame 242 is compared with the previously transmitted frame, and if multiple items are that same in both frames, then those items are replaced by a bit in a bit vector in the frame 242. For example, if a current frame included three compressed data samples [<1,34,56,117><24, 34,56,118>. <1234, 2045, 4095>] and a previous frame included the compressed data sample [<1,34,56,117> <24, 54,196,6>, <115, 316, 2048>], then the first sample of the present frame, <1,34,56,117>, can be identified as "same as previous" in a corresponding bit vector.

Because many of the compression processes described above require a statistical reference (e.g., reference values from which compressed offsets can be used to generate the actual value compressed), the compressed data are provide in a compression context. A compression context defines first, second and third order redundancy references for each of the identified first, second and third order redundancies. The compression context can be provided as compression context data 244 to a receiving frame decoder. The receiving frame decoder, such as the frame decoder 250, can then use the compression context data, such as the compression context data 252, to establish reference values for the decompression of subsequently received frames, such as frames 254. The compression context also holds the previously received frame to compare for any redundancies marked SAME-AS-PREVIOUS.

After receiving the compressed data, the logging node can store the data then update the compression content. The compression is context is updated by first decompressing the data (e.g., by LZ77) to obtain the sequence of numbers that represents the encoded frame. Subsequently, a bit vector is examined to detect any samples marked SAME-AS-PREVIOUS. If samples are marked the same, the samples are copied into the current frame. Then the data is reconstructed by identifying the third order, second order, and first order redundancies in that order.

In some implementations, the compression context data 242 includes all relevant variables and the constant information. The compression context data 242 can be generated by analyzing the first statistical data samples 202 of the statistical data received in the specified canonical form.

§2.2 Compression Processing Example

The data of Table 1 can, for example, be used to generate compression context data, or, alternatively, if a compression context has been established, can be compressed according to the compression context.

The canonical form of each sample of statistical data is [URL, CPU %, Disconnects, URLs Blocked, Time]. Thus, in uncompressed form, the first record is: [(4, [www.example1.com, www.example2.com, www.example1.com, www.example3.com], 12, 0, 1, 1000]

However, the first order redundancy of www.example1.com can be exploited by a presence vector representation. With respect to the URLs, upon receipt in the first instance, each URL may be indexed. For example, the indices of www.example1.com, www.example2.com, and www.example3.com can be 100, 101 and 102, respectively. Furthermore, the name of each data instance field is constant, and thus can be indexed. For example, the indices of URL, CPU %, Disconnects, URLs Blocked and Time can be 0, 1, 2, 3, and 4, respectively. The four statistical data samples above thus compress to:

[(0, [(100, 2), (101,1), (102, 1)]), (1, 12), (2, 0) (3, 1), (4, 1000)]
[(0, [(100, 1), (101,2), (102, 1)]), (1, 13), (2, 0) (3, 0), (4, 1001)]
[(0, [(100, 1), (101,2), (102, 1)]), (1, 15), (2, 0) (3, 0), (4, 1002)]
[(0, [(100, 1), (101,1), (102, 2)]), (1, 18), (2, 1) (3, 0), (4, 1003)]

The data classifier 210 can be configured to identify the first, second and third order redundancies to establish a compression context. For example, based on the data above, the data classifier 210 can determine that the data instances for CPU % have a second order redundancy of 1; that the data instances for Disconnects and URLs Blocked are occasional occurrence data types; and that the data instances for the Time is time varying and predictable (or, alternatively, a Vary by 1 type, or Time Varying Linear type). Compression context data can then be provided to a receiving frame decoder in another system that utilizes the compressing processing system 200.

Assuming that a compression context is known, a constant time change can be omitted by differential compression to generate further compressed records of statistical data:

[(4,1)]
[(0, [(100, 2), (101,1), (102, 1)]), (1, 12), (3, 1)]
[(0, [(100, 1), (101,2), (102, 1)]), (1, 13)]
[(0, [(100, 1), (101,2), (102, 1)]), (1, 15)]
[(0, [(100, 1), (101,1), (102, 2)]), (1, 18), (2, 1)]

The third order redundancy of 1, however, for the CPU % data instance, can also be compressed by a delta compression process:

[(0, [(100, 2), (101,1), (102, 1)]), (1, 1), (3, 1)]
[(0, [(100, 1), (101,2), (102, 1)]), (1, 1)]
[(0, [(100, 1), (101,2), (102, 1)]), (1, 1)]
[(0, [(100, 1), (101,1), (102, 2)]), (1, 1), (2, 1)]

Provided the compression context identifies the third order redundancy, the delta compression of the CPU % data instance can be further compressed by the differential compression process:

[(4.1)], [(1,1)]
[(0, [(100, 2), (101,1), (102, 1)]), (3, 1)]
[(0, [(100, 1), (101,2), (102, 1)])]
[(0, [(100, 1), (101,2), (102, 1)]]
[(0, [(100, 1), (101,1), (102, 2)], (2, 1)]

In the frame, the records present are that of (0, 1, 2, 3, 4, 100, 101, 102). By recording their presence in a bit vector, the samples gets compressed to:

[(4,1), (1,1)]
[0,100,101,102,3],[2,1,1,1],
[0,100, 101, 102], [1,2,1],
[0,100,101,102,1], [1,2,1],
[0, 100, 101, 102, 2], [1,1,2,1]

By ordering the frame with attributes and common changes first, and specific changes subsequently, a highly compressible frame is produced, e.g.:

[(4,1), (1,)] [0,100,101,102,3], [0,100,101,102], [0,100, 101, 102,1], [0,100,101,102,2] [2,1,1,1], [1,2,1],[1,2,1], [1,1,2,1]

The statistical data samples above, represented in compressed form for a given compression content, can then be grouped into this frame by the frame encoder 240 and transmitted to a receiving device.

§4.0 Example Process Flows

Figure 3:
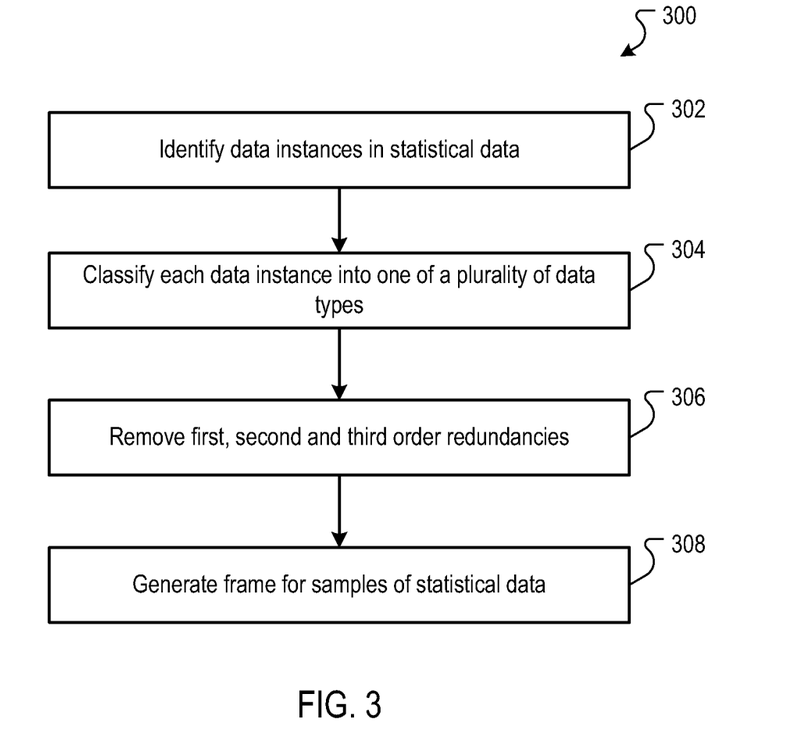
FIG. 3 is a flow diagram of an example process for compressing statistical data.

FIG. 3 is a flow diagram of an example process for compressing statistical data. The process 300 can, for example, be used in the example compression system 200 of FIG. 2, or in other software and/or hardware devices that can be configured to perform the following operations.

Stage 302 identifies data instances in statistical data. For example, the data classifier 210 can identify data instances, such as values for the data instances listed in Table 1.

Stage 304 classifies each data instance into one of a plurality of data types. For example, the data classifier 210 can classify the data instances into the data types listed in Table 2.

Stage 306 removes first, second and third order redundancies. For example, the first field encoder 220, the second field encoder 230 and the frame encoder 240 can remove the first, second and third order redundancies as described above.

Stage 308 generates a frame for samples of statistical data. For example, the frame encoder 240 can generate a frame 242 as described above.

Figure 4:
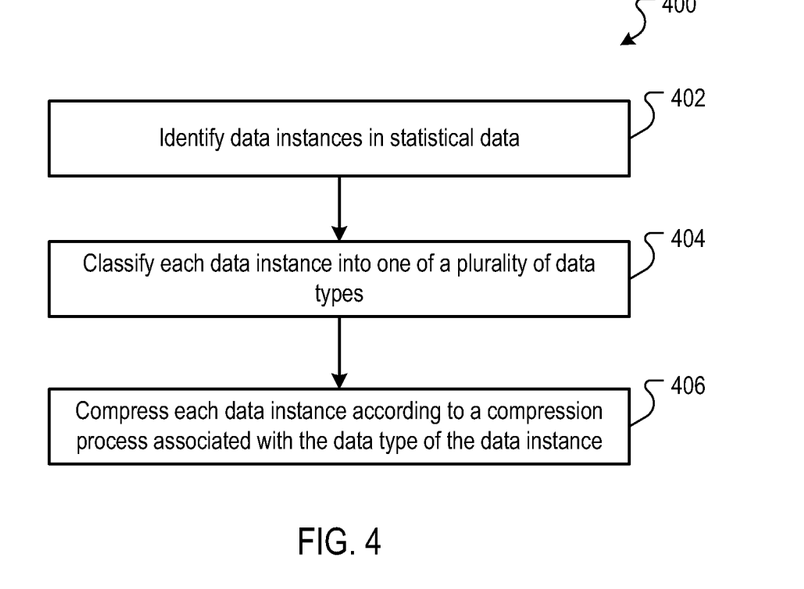
FIG. 4 is a flow diagram of another example process for compressing statistical data.

FIG. 4 is a flow diagram of another example process 400 for compressing statistical data. The process 400 can, for example, be used in the example compression system 200 of FIG. 2, or in other software and/or hardware devices that can be configured to perform the following operations.

Stage 402 identifies data instances in statistical data. For example, the data classifier 210 can identify data instances, such as values for the data instances listed in Table 1.

Stage 404 classifies each data instance into one of a plurality of data types. For example, the data classifier 210 can classify the data instances into the data types listed in Table 2.

Stage 406 compresses each data instance according to a compression process associated with the data type of the data instance. For example, the first field encoder 220, the second field encoder 230 and the frame encoder 240 can compress each data type according to the compression processes listed in Table 2.

Figure 5:
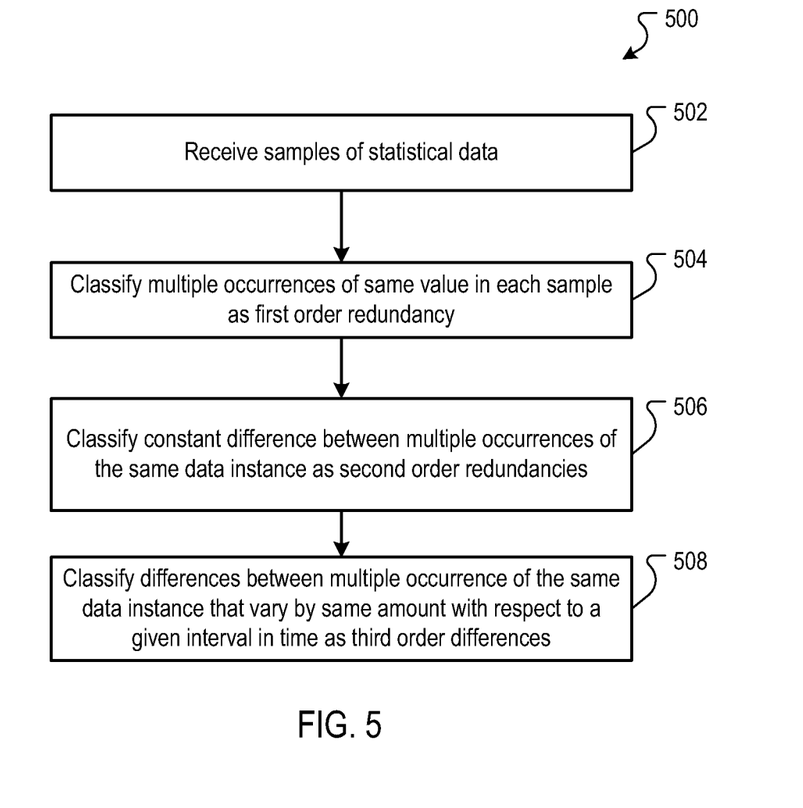
FIG. 5 is a flow diagram of an example process for classifying first, second and third order redundancies.

FIG. 5 is a flow diagram of an example process 500 for classifying first, second and third order redundancies. The process 500 can, for example, be used in the example compression system 200 of FIG. 2, or in other software and/or hardware devices that can be configured to perform the following operations. The data generated by the process 500 can be used to encode statistical data, and/or can be used to generate a compression context.

Stage 502 receives samples of statistical data. For example, the data classifier 210 can receive statistical data 202 in the form of statistical data samples.

Stage 504 classifies multiple occurrences of same value in each sample as first order redundancy. For example, the data classifier 210 can classify multiple occurrences of same value, e.g., a URL address, in each sample as first order redundancy as described above.

Stage 506 classifies constant differences between multiple occurrences of the same data instance as second order redundancies. For example, the data classifier 210 can classify constant differences between multiple occurrences of the same data instance as second order redundancies, e.g., statistics data for times 1001 and 1002 for the data instance CPU %.

Stage 508 classifies differences between multiple occurrences of the same data instance that vary by same amount with respect to a given interval in time as third order differences. For example, the data classifier 210 can classify differences between multiple occurrences of the same data instance that vary by same amount with respect to a given interval as third order redundancy, as described above.

The example system 200 has been described with various encoding and decoding components. However, such functional distributions need not be implemented; a software instantiation of a single module or logical structure can also be used. Furthermore, additional components and function distributions can also be used.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a tangible program carrier for execution by, or to control the operation of, data processing apparatus.

A computer program (also known as a program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Additionally, the logic flows and structure block diagrams described in this patent document, which describe particular methods and/or corresponding acts in support of steps and corresponding functions in support of disclosed structural means, may also be utilized to implement corresponding software structures and algorithms, and equivalents thereof. The processes and logic flows described in this specification can be performed by one or more programmable processors executing one or more computer programs to perform functions by operating on input data and generating output.

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD ROM disks. The processor and the memory can be supplemented by, or incorporated in, special purpose logic circuitry.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client server relationship to each other.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the subject matter described in this specification have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

This written description sets forth the best mode of the invention and provides examples to describe the invention and to enable a person of ordinary skill in the art to make and use the invention. This written description does not limit the invention to the precise terms set forth. Thus, while the invention has been described in detail with reference to the examples set forth above, those of ordinary skill in the art may effect alterations, modifications and variations to the examples without departing from the scope of the invention.

What is claimed is:

1. A system, comprising:
   a data type classifier configured to identity data instances in statistical data associated with system monitoring and classify each data instance into one of a plurality of data types, each data type being associated with a corresponding compression process and being indicative of one of a first order redundancy, a second order redundancy, or a third order redundancy;
   a first field encoder configured to remove first order redundancies in the data instances associated with a data type indicative of the first order redundancy;
   a second field encoder configured to remove second order redundancies in the data instances associated with a data type indicative of the second order redundancy; and
   a frame encoder configured to remove third order redundancies in the data instances associated with a data type indicative of the third order redundancy, wherein the corresponding compression process used by each of the first field encoder, the second field encoder, and the frame encoder is different and all compression is lossless;
   wherein the plurality of data types are based on the statistical data and comprise any of a constant data type, a predictable time varying type, an occasional occurrence type, a time varying type, and a unit change type; and
   wherein the system monitoring is performed by a distributed security system and the statistical data is from an external network from the distributed security system, wherein the distributed security system is configured to interface between a plurality of users of the external network and the Internet and to monitor data communications therein to form the statistical data.

2. The system of claim 1, wherein the data type classifier is further configured to receive statistical data samples of data instances, and to classify first order redundancies in each statistical data sample.

3. The system of claim 2, wherein the data type classifier is further configured to classify second order redundancies in the data instances for two or more statistical data samples.

4. The system of claim 3, wherein the data type classifier is configured to classify third order redundancies in the data instances for three or more statistical data samples.

5. The system of claim 4, wherein the frame encoder is further configured to compress statistical data samples into a frame.

6. The system of claim 4, wherein the frame encoder is further configured to generate compression context data that defines a compression context for statistical data that defines first, second and third order redundancy references for each of the identified first, second and third order redundancies.

7. The system of claim 4, further comprising:
   a frame decoder configured to receive compression context data from another frame encoder and compresses frames from the other frame encoder, and to decode the frames into the statistical data samples of the data instances.

8. A method, comprising:
   performing system monitoring with a distributed security system that is connected to an external network, wherein the distributed security system is configured to interface between a plurality of users of the external network and the Internet and to monitor data communications therein to form statistical data;
   identifying data instances in the statistical data associated with the system monitoring;
   classifying each data instance into one of a plurality of data types, each data type being associated with a corresponding compression process and being indicative of one of a first order redundancy, a second order redundancy, or a third order redundancy;
   removing first order redundancies in the data instances associated with a data type indicative of the first order redundancy;
   removing second order redundancies in the data instances associated with a data type indicative of the second order redundancy; and
   removing third order redundancies in the data instances associated with a data type indicative of the third order redundancy, wherein the corresponding compression process used for removing each of the first order redundancies, the second order redundancies, and the third order redundancies is different and all compression is lossless;
   wherein the plurality of data types are based on the statistical data and comprise any of a constant data type, a predictable time varying type, an occasional occurrence type, a time varying type, and a unit change type.

9. The method of claim 8, wherein identifying data instances in statistical data comprises:
   receiving statistical data samples of data instances; and
   identifying first order redundancies in each statistical data sample.

10. The method of claim 9, wherein classifying each data instance into one of a plurality of data types comprises classifying second order redundancies in the data instances for two or more statistical data samples.

11. The method of claim 10, wherein classifying each data instance into one of a plurality of data types comprises classifying third order redundancies in the data instances for three or more statistical data samples.

12. The method of claim 11, further comprising compressing three or more statistical data samples into a frame.

13. The method of claim 8, further comprising:
   subsequent to the removing first order redundancies, generating new second order redundancies in the data instances based on the removal of the first order redundancies, wherein the removing second order redundancies comprises removing the second order redundancies from the classifying step and the new second order redundancies.

14. A computer-implemented method, comprising:
performing system monitoring with a distributed security system that is connected to an external network, wherein the distributed security system is configured to interface between a plurality of users of the external network and the Internet and to monitor data communications therein to form statistical data;
identifying data instances in the statistical data associated with the system monitoring;
classifying each data instance into one of a plurality of data types, each data type being associated with a corresponding compression process, wherein the plurality of data types are based on the statistical data and comprise any of a constant data type, a predictable time varying type, an occasional occurrence type, a time varying type, and a unit change type; and
compressing each data instance according to the compression process of the associated data type of the data instance, wherein the compressing is different based on the associated data type and lossless for all of the plurality of data types.

15. The method of claim 14, wherein:
classifying each data instance into one of a plurality of data types comprises classifying a data instance into a constant data type, the constant data type being associated with a presence vector compression process; and
compressing each data instance according to the compression process of the associated data type comprises compressing the data instance of the constant data type into a presence vector.

16. The method of claim 14, wherein:
classifying each data instance into one of a plurality of data types comprises classifying a data instance into a predictable time varying type, the predictable time varying type being associated with a differential compression process; and
compressing each data instance according to the compression process of the associated data type comprises compressing the data instance of the predictable time varying type into a differential value only if the value of the data instance deviates from a predicted value.

17. The method of claim 14, wherein:
classifying each data instance into one of a plurality of data types comprises classifying a data instance into a predictable time varying type, the predictable time varying type being associated with a differential compression process; and
compressing each data instance according to the compression process of the associated data type comprises compressing the data instance of the predictable time varying type into a differential value indicative of a change of a current value of the data instance from a previous value of the data instance only if the value of the data instance deviates from a predicted value.

18. The method of claim 14, wherein:
classifying each data instance into one of a plurality of data types comprises classifying a data instance into an occasional occurrence type, the occasional occurrence type being associated with a differential compression process; and
compressing each data instance according to the compression process of the associated data type comprises compressing the data instance of the occasional occurrence type into an occurrence value only if the value of the data instance indicates an occurrence of an event associated with the data instance.

19. The method of claim 14, wherein:
classifying each data instance into one of a plurality of data types comprises classifying a data instance into a time varying type, the time varying type being associated with a delta compression process; and
compressing each data instance according to the compression process of the associated data type comprises compressing the data instance of the time varying type into a differential value based on a current value of the data instance and a previous value of the data instance.

20. The method of claim 14, wherein:
classifying each data instance into one of a plurality of data types comprises classifying a data instance into a unit change type, the unit change type being associated with a bit vector compression process; and
compressing each data instance according to the compression process of the associated data type comprises compressing the data instance of the unit change type into a bit vector representative of a unit change.

21. The method of claim 20, wherein the unit change is one.

22. The method of claim 14, further comprising:
performing the system monitoring with one of a plurality of processing nodes, each of the processing nodes comprising a decision system monitoring the data communications and forming the statistical data based thereon;
performing the compressing by the one of the plurality of processing nodes; and
transmitting compressed data from the one of the plurality of processing nodes to a logging node, wherein the distributed security system comprises the plurality of processing nodes and the logging node.

23. The method of claim 14, wherein the statistical data is represented in a canonical form based on the plurality of users performing Web browsing, and wherein the corresponding compression process is based upon first, second, and third order redundancies associated with the canonical form.

24. The method of claim 23, wherein the canonical form comprises URL address, CPU percentage, session disconnects, blocked URLs, and an associated time stamp;
wherein the corresponding compression process comprises a presence vector representation for the URL address.

* * * * *